(12) United States Patent
Leek

(10) Patent No.: US 10,599,990 B2
(45) Date of Patent: Mar. 24, 2020

(54) QUANTUM INFORMATION PROCESSING SYSTEM

(71) Applicant: Oxford University Innovation Limited, Oxford (GB)

(72) Inventor: Peter Leek, Oxford (GB)

(73) Assignee: OXFORD UNIVERSITY INNOVATION LIMITED, Oxford (GB)

( * ) Notice: Subject to any disclaimer, the term of this patent is extended or adjusted under 35 U.S.C. 154(b) by 0 days.

(21) Appl. No.: 16/534,644

(22) Filed: Aug. 7, 2019

(65) Prior Publication Data

US 2019/0362260 A1 Nov. 28, 2019

Related U.S. Application Data

(63) Continuation of application No. 15/749,463, filed as application No. PCT/GB2016/052350 on Jul. 29, 2016, now Pat. No. 10,380,495.

(30) Foreign Application Priority Data

Aug. 4, 2015 (GB) .................................. 1513774.8

(51) Int. Cl.
 *H01L 39/22* (2006.01)
 *G06N 10/00* (2019.01)
 *H03K 19/195* (2006.01)

(52) U.S. Cl.
 CPC ........... *G06N 10/00* (2019.01); *H01L 39/223* (2013.01); *H03K 19/1952* (2013.01)

(58) Field of Classification Search
 CPC .... G06N 10/00; H01L 39/223; H03K 19/1952
 See application file for complete search history.

(56) References Cited

U.S. PATENT DOCUMENTS 5,831,278 A * 11/1998 Berkowitz ............ H01L 39/225
 257/31
2002/0130313 A1* 9/2002 Zagoskin ............... B82Y 10/00
 257/9

(Continued)

OTHER PUBLICATIONS

Notification of Transmittal, International Search Report, and Written Opinion (Forms PCT/ISA/220, PCT/ISA/210, and PCT/ISA/237), for International Application No. PCT/GB2016/052350, dated Oct. 27, 2016, 13 pages.

(Continued)

*Primary Examiner* — Alexander H Taningco
*Assistant Examiner* — Kurtis R Bahr
(74) *Attorney, Agent, or Firm* — Withrow & Terranova, P.L.L.C.; Vincent K. Gustafson

(57) ABSTRACT

A building block for a quantum information processing system includes a superconducting qubit having a Josephson junction connected between two superconducting electrodes. The two superconducting electrodes are coaxial and coplanar. The building block also includes a control line coupled to the superconducting qubit and arranged to control the state of the superconducting qubit, and/or a readout element coupled to the superconducting qubit and arranged to measure the state of the superconducting qubit. The control line and/or the readout element are arranged out of plane with respect to the two superconducting electrodes.

20 Claims, 5 Drawing Sheets

(56) References Cited

U.S. PATENT DOCUMENTS

Figure 1:
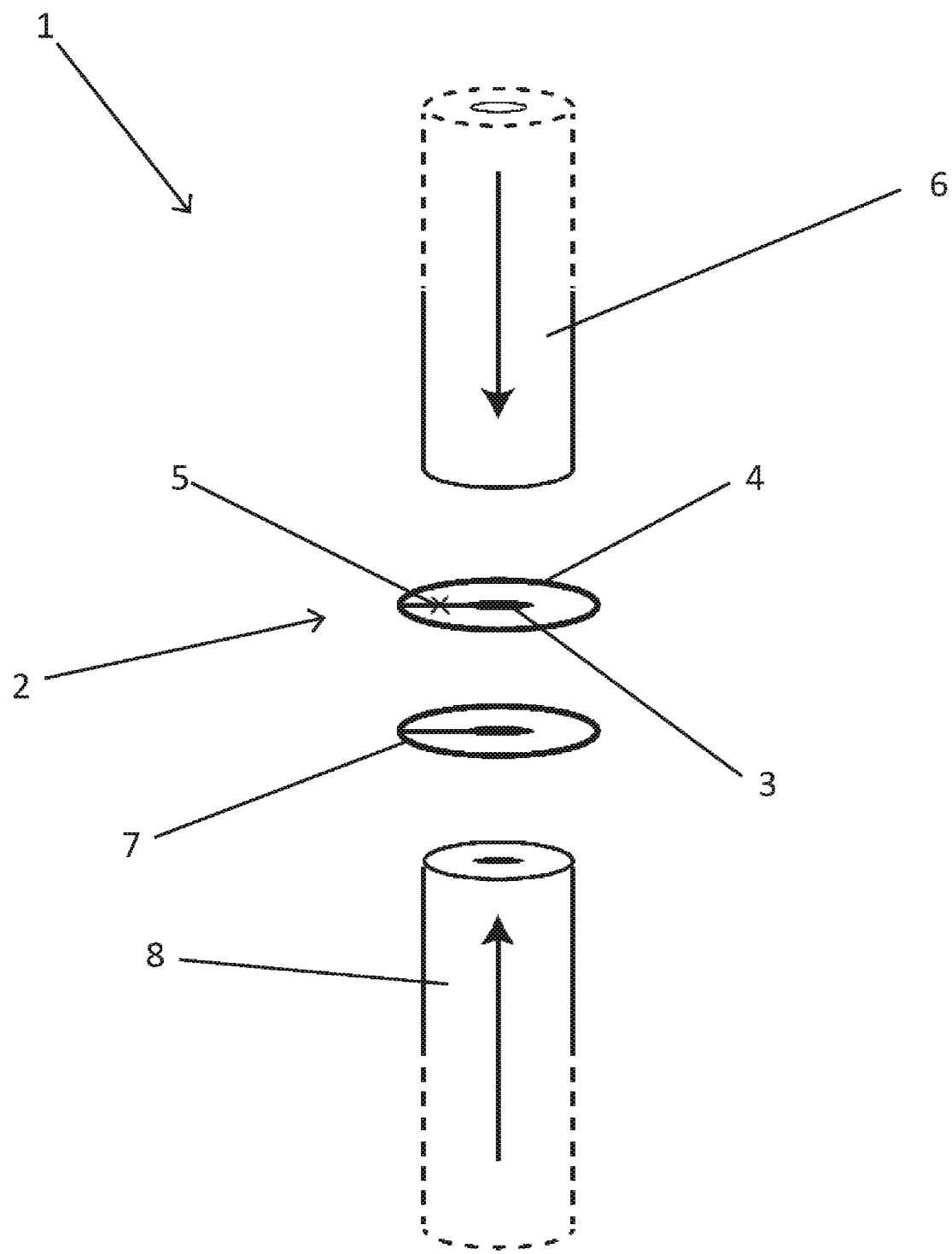

2003/0094606 A1* 5/2003 Newns .................. B82Y 10/00
257/31
2014/0175380 A1* 6/2014 Suzuki .................. H01L 27/20
257/31
2014/0264787 A1* 9/2014 Abraham .............. G06N 10/00
257/664
2016/0267032 A1* 9/2016 Rigetti ................... G06F 13/36

OTHER PUBLICATIONS

Julian S. Kelly et al., "Fault-tolerant superconducting qubits," Dissertation for Ph.D. in Physics at University of California, Mar. 2015. Retrieved from the Internet: URL: http://web.physics.ucsb.edu/-martinisgroup/theses/Kelly2015.pdf [retrieved on Jul. 15, 2016] (207 pages).

Martin P. Weides, et al., "Multiphoton dressing of an anharmonic superconducting many-level quantum circuit," 2015 Quantum Metamaterials Workshop QMM Spetses, Jun. 4, 2015; Retrieved from the Internet: URL: https://qcn.physics.uoc.gr/qmm2015/sites/files/qmm2015/Weides QMM Spetses-1.pdf [retrieved on Oct. 19, 2016] (33 pages).

Dale Li, et al., "Remote Sensing and Control of Phase Qubits," Oct. 5, 2010; Condensed Matter Superconductivity Archive arXiv:1010.0975v1 [cond-mat.supr-con]; Retrieved from the Internet: URL: https://arxiv.org/pdf/1010.0975 [retrieved on Jan. 23, 2018] (3 pages).

Martin P. Weides et al., "Coherence in a transmon qubit with epitaxial tunnel junctions," Dec. 12, 2011; Condensed Matter Superconductivity Archive arXiv:1111.5083 [cond-mat.supr-con]; Retrieved from the Internet: URL: https://arxiv.org/pdf/1111.5083v3 [retrieved on Jan. 23, 2018] (4 pages).

Martin Sandberg et al., "Radially symmetric transmon with long lifetime", Abstract Submitted for the MAR14 Meeting of the American Physical Society, Nov. 15, 2013, abstract id. M36.005 (1 page).

Hanhee Paik, et al., "Observation of high coherence in Josephson junction qubits measured in a three-dimensional circuit QED architecture", Nov. 3, 2011; Condensed Matter Quantum Physics Archive; arXiv:1105.4652 [quant-ph]; Retrieved from the Internet: URL: https://arxiv.org/pdf/1105.4652.pdf [retrieved on Jan. 23, 2018] (5 pages).

Rami Barends et al: "Logic gates at the surface code threshold: Superconducting qubits poised for fault-tolerant quantum computing," Feb. 19, 2014; Condensed Matter Quantum Physics Archive; arXiv:1402.4848 [quant-ph]; Retrieved from the Internet: URL: https://arxiv.org/ftp/arxiv/papers/1402/1402.4848.pdf [retrieved on Jan. 23, 2018] (15 pages).

Search Report under Section 17(5) for United Kingdom Patent Application No. GB1513774.8 dated Feb. 22, 2016, 3 page.

Notice of Allowance for U.S. Appl. No. 15/749,463, dated May 22, 2019, 8 pages.

Final Office Action for U.S. Appl. No. 15/749,463, dated Mar. 1, 2019, 15 pages.

Non-Final Office Action for U.S. Appl. No. 15/749,463, dated Nov. 5, 2018, 14 pages.

* cited by examiner

QUANTUM INFORMATION PROCESSING SYSTEM

This application is a continuation of U.S. patent application Ser. No. 15/749,463 filed on Jan. 31, 2018 and subsequently issuing as U.S. Pat. No. 10,380,495 on Aug. 13, 2019, which is a 35 U.S.C. § 371 national phase filing of International Application No. PCT/GB2016/052350 filed on Jul. 29, 2016, and claims the benefit of United Kingdom Patent Application No. 1513774.8 filed on Aug. 4, 2015. The entire disclosures of the foregoing applications and patent are hereby incorporated by reference herein, in their respective entireties.

This invention relates to quantum information processing systems and building blocks for such systems, in particular to superconducting building blocks for quantum information processing systems.

In a superconducting circuit implementation of a quantum computer, the base unit of quantum computing, a qubit (quantum bit), can be implemented physically in a number of different ways. Typically, one or more Josephson junctions are combined with capacitors and/or inductors, to form a high quality anharmonic circuit, the lowest quantised energy levels of which are used as the qubit. For example, a commonly implemented and successful design, known as a charge qubit or transmon, consists in its simplest form of a single Josephson junction in parallel with a capacitor. The two electrodes of the qubit can be arranged in a number of ways; examples include arranging the electrodes collinearly in a geometry reminiscent of a dipole antenna, or using interdigitated capacitors, or with one electrode in a cross shape, and the other realised as a common ground plane. Control and measurement circuitry is typically implemented using planar circuitry integrated on-chip with the qubits, and/or using 3D electromagnetic waveguides and cavities, in which the qubit chips are embedded.

An important consideration in the design of a quantum information processing system is to maximise the coherence time of the qubits (the lifetime of the fragile quantum states of the qubits that must be preserved to carry out the quantum computations). This requires a high level of control of the electromagnetic environment of the qubits, which needs to be engineered such that the qubits cannot easily leak their quantum information into it. A commonly implemented approach to achieve this environmental control is to embed the qubits within, or strongly couple them to, high quality electromagnetic resonators, either on-chip or in 3D, with resonant frequencies that are different from the qubit frequencies, thus preventing this energy leakage due to the inability of the environment to accept energy at the qubit frequencies. This approach, known as circuit quantum electrodynamics, also provides a convenient method of measurement of the quantum states of the qubits, since the resonators experience measurable frequency shifts when the qubits change their quantum states.

The macroscopic size of superconducting qubits makes it easy to couple control signals to the qubit, enabling fast operations to be performed relatively easy. However, a linear arrangement of the superconducting electrodes of a qubit typically means that it couples strongly to the environment, particularly to electromagnetic fields that are homogeneous on the size scale of the qubit, which are often present in the environment. The result of this is that the coherence time of the quantum superposition state of the qubit, which is desired to be as long as possible in order to be able to perform quantum computations using the qubit, is reduced. This is because it is easy for the qubit to radiate energy when it is coupled to an electromagnetic field.

In order to perform any useful quantum computing, it is necessary to implement an architecture consisting of a large number of qubits, with couplings between them as well as wiring to enable control and readout of all (or a key subset) of the qubits. However, if such an architecture is implemented using in-plane couplings, and control and readout wiring, e.g. on the surface of a fabricated chip or circuit board, it becomes increasingly difficult with size to spatially accommodate the necessary wiring. This is because of the fundamental fact that the edges of a two-dimensional array of N qubits scales as the square root of N such that, for example, for a square arrange of M qubits by M qubits (N=$M^2$ qubits in total), control and readout lines of order $M^2$ need to be threaded through the edges (between the 4M edge qubits). This may hinder the implementation of a quantum computer of a practically useful scale having a 2D array of qubits.

This invention aims to provide an improved and scalable architecture for quantum computing systems.

When viewed from a first aspect the invention provides a building block for a quantum information processing system comprising:

a. a superconducting qubit comprising a Josephson junction connected between two superconducting electrodes, wherein the two superconducting electrodes are coaxial and coplanar;

b. a control line coupled to the superconducting qubit and arranged to control the state of the superconducting qubit; and/or c. a readout element coupled to the superconducting qubit and arranged to measure the state of the superconducting qubit;

d. wherein the control line and/or the readout element are arranged out of plane with respect to the two superconducting electrodes.

When viewed from a second aspect the invention provides a quantum information processing system comprising a plurality of building blocks as recited in the first aspect of the invention;

a. wherein at least some (and preferably all) of the superconducting qubits in the plurality of building blocks are coupled to one or more of the other of the superconducting qubits in the plurality of building blocks.

The present invention relates to a quantum information processing system in which a superconducting qubit is provided as a basic building block. The superconducting qubit is formed from a Josephson junction connected between two coaxial and coplanar superconducting electrodes, i.e. the weak link of the Josephson junction, e.g. a barrier of insulating material, is provided between the two coaxial and coplanar superconducting electrodes. The Josephson junction combined with the capacitance between these electrodes implements a charge qubit, or Transmon (in the case that the Josephson energy is much larger than the charging energy associated with the capacitance).

Coupled to the superconducting qubit is preferably a control line which is arranged to control the quantum state of the individual qubit, e.g. by exposing the qubit to a microwave pulse of controlled amplitude and phase. This control line may also be used in the implementation of multi-qubit operations in a multi-qubit system, e.g. as outlined in the second aspect of the invention. Also preferably coupled to the superconducting qubit is a readout element which is arranged to measure the quantum state of the superconducting qubit, e.g. during or after quantum computations, in the implementation of quantum algorithms, or to learn the result of a quantum computation. The control line and/or the readout element are arranged out of plane with respect to the plane of the two superconducting electrodes of the qubit, i.e. these elements are provided at a position which does not lie in the same plane as that two superconducting electrodes.

The invention also extends to a quantum information processing system which includes multiple building blocks, with each building block being coupled, i.e. electromagnetically, to at least one of the other building blocks in the system.

The Applicant has recognised that by providing a building block for a quantum information processing system in which the superconducting qubit has coaxial electrodes, this helps to significantly reduce the electromagnetic coupling of the qubit to uniform electromagnetic fields compared to a qubit having a linear geometry, because the electrodes of the qubit do not lie along a single direction, i.e. they are coaxial, e.g. having a circular symmetry. The qubit may couple to electromagnetic fields having a coaxial components or a substantial field gradient at the location of the qubit; however these fields are much less likely to be naturally present in the qubit's environment. Thus the qubit is isolated effectively from the electromagnetic environment, helping to increase the coherence time of the qubit.

Furthermore, because the far field radiation of a qubit with coaxial electrodes decreases very rapidly at distances larger than the size of the qubit, the qubit couples only very weakly, if at all, to other electromagnetic objects in the system, e.g. other qubits, in addition to the isolation from the electromagnetic environment as described above. This electromagnetic isolation again helps to increase the coherence time of the qubit, as well as improving the practicality of a building a large-scale multi-qubit system. This compares to a conventional qubit with a linear configuration that typically has a large dipole moment and provides a far more significant electromagnetic field at large distances from the qubit.

The Applicant has also recognised that by providing a building block for a quantum information processing system in which the control and readout elements are arranged out of plane with respect to the plane of the two superconducting electrodes of the qubit, the topology of a quantum information processing system comprising a plurality of building blocks is able to scale in the same way as the number of building blocks. This is because although a plurality of couplings are provided to the qubit, as the control and readout elements are arranged out of plane with respect to the electrodes of the qubit they do not require any space to be provided for them in the plane of the electrodes. It will be appreciated that the same is not possible for conventional quantum computing systems, e.g. implemented using in-plane geometry, as all of the components and connections have to be provided in the same plane, which becomes increasingly difficult as the system has more than a few qubits.

The two superconducting electrodes of the qubit may be arranged in any suitable and desired coaxial and coplanar configuration. In a preferred embodiment the two superconducting electrodes of the qubit are radially symmetric, i.e. circular. This configuration of the two electrodes even further helps to reduce the electromagnetic coupling of the qubit to the environment, because there is no direction in the plane of the electrodes in which the electrodes are oriented more than other directions. The outer of the two coaxial superconducting electrodes may comprise a ground plane, e.g. shared with other qubits when the system comprises a plurality of qubits.

The superconducting electrodes may be continuous, e.g. in a circle. However in one embodiment the outer of the two electrodes is discontinuous, e.g. at a (single) point. Thus there may be a small gap in the outer ring electrode of the qubit. This helps to prevent persistent circulating currents and trapped magnetic flux between the two superconducting electrodes.

The qubit may be formed in any suitable and desired manner. In a preferred embodiment the qubit, i.e. including the two superconducting electrodes and the weak link, is formed using micro-fabrication of low loss superconducting materials, such as aluminium, on a low loss dielectric substrate, such as sapphire or silicon.

In one embodiment the qubit is arranged to be frequency tuneable, e.g. by incorporating two Josephson junctions connected in parallel between the two superconducting electrodes and an out-of-plane control line that controls the magnetic flux which threads the gaps enclosed by the superconducting electrodes and the Josephson junctions. This embodiment enables implementation of control operations that require frequency tuneable qubits.

The control line of the building block may be provided in any suitable and desired manner. In a preferred embodiment the control line is arranged coaxially with the two superconducting electrodes of the qubit. Additionally or alternatively the control line comprises a coaxial cable, e.g. having a geometry matching or similar to the coaxial electrodes of the qubit. This arrangement enables the control line to be coupled to the qubit in a straightforward manner and to control a single qubit highly selectively from a plurality of qubits in a multi-qubit system.

In another embodiment the control line comprises a magnetic flux control line. Such a magnetic flux control line preferably comprises a coaxial line with an electrically shorted end, wherein the coaxial line has a central conductor connected to an outer ground conductor, e.g. in a manner that enables currents in the coaxial cable to produce a magnetic flux in the nearby qubit. This allows the control line to control the frequency of the qubit, e.g. in the embodiment in which the qubit is frequency tuneable.

The control line is arranged to control the state of the qubit in any suitable and desired manner. Preferably the control line is arranged to radiate the qubit with electromagnetic radiation, e.g. with microwaves. In a preferred embodiment the control line is arranged to apply a pulse of electromagnetic radiation (e.g. microwaves) to the qubit. The length, phase and/or amplitude of the pulse of electromagnetic radiation may be varied to implement universal single qubit control. Thus preferably the control line is arranged to provide universal control of the quantum state of the qubit.

The readout element of the building block may be provided in any suitable and desired manner. In a preferred embodiment the readout element comprises a, e.g. microwave, resonator coupled to the superconducting qubit, e.g. arranged coaxially with the two superconducting electrodes of the qubit. The microwave resonator may comprise a lumped element microwave resonator, e.g. having the same geometry as the qubit and only differing by the use of a linear inductor in place of the Josephson junction. Therefore, in a particularly preferred embodiment, the two superconducting electrodes, the control line and/or the readout element are arranged coaxially. Additionally or alternatively the readout element comprises a coaxial cable, e.g. having a geometry matching or similar to the coaxial electrodes of the qubit. This arrangement enables the readout element to be coupled to the qubit in a straightforward manner and to perform highly selective measurement of a single qubit from a plurality of quits in a multi-qubit system.

The readout element is arranged to measure the state of the qubit in any suitable and desired manner. In a preferred embodiment (when the readout element comprises a coaxial cable and microwave readout resonator), the coaxial cable of the readout element is arranged to measure the response of the readout microwave resonator (that is coupled to the qubit), e.g. at a certain frequency, from which the state of the qubit may be inferred.

In one embodiment of the building block, the control line and readout element may be formed as a single element, i.e. combined into the same element, preferably comprising a coaxial cable and a coaxial readout resonator, which is arranged for both single qubit control and measurement, e.g. with the coaxial cable arranged behind the readout resonator.

In the quantum information processing system, preferably each control line and/or readout element is only coupled to a single qubit, i.e. preferably there is a one to one relationship between a qubit and its associated control line and/or readout element. The quantum information processing system may be provided such that not all qubits have an associated control line and/or readout element, e.g. to implement a particular quantum computing architecture such as the surface code.

In the quantum information processing system, each of the plurality of building blocks can be coupled to one or more of the other of the plurality of building blocks in any suitable and desired manner. In a preferred embodiment one or more, and preferably all, of the plurality of building blocks are coupled to the nearest other building block to them. Coupling building blocks to their nearest neighbour(s) helps to provide a simple scalable architecture which may be capable of implementing fault tolerant quantum computing schemes such as the surface code.

Preferably the coupling comprises a capacitance between the outer electrodes of adjacent qubits, e.g. whose capacitance can be adjusted by changing the geometry and/or spacing of the qubit electrodes. Preferably the quantum information processing system further comprises one or more additional superconducting qubits, which may be connected to one or more of the building blocks in any suitable and desired way, such as via capacitances between the outer electrodes of adjacent qubits. For example, the additional superconducting qubits may or may not be connected to control lines and/or readout elements.

The plurality of building blocks in the quantum information processing system may be arranged in any suitable and desired way. In a preferred embodiment the building blocks are arranged in a, e.g. regular, array. The type of array may depend on the number of other building blocks to which each building block may be desired to be coupled. For example the array may comprise a square array (i.e. with the qubits arranged in rows and columns), in which case each qubit may be coupled to up to four other qubits (assuming, for example, that only nearest neighbour couplings are used). In another embodiment the array may comprise a triangular array, in which case each qubit may be coupled to up to six other qubits (assuming, for example, that only nearest neighbour couplings are used). In another embodiment the array may comprise a hexagonal array, in which case each qubit may be coupled to up to three other qubits (assuming, for example, that only nearest neighbour couplings are used). Other geometries may be used as is suitable and desired.

The plurality of qubits in the quantum information processing system may be provided in a single plane, i.e. the plane of the superconducting electrodes. However embodiments are also envisaged in which multiple planes of qubits are provided, e.g. stacked on top of each other such that the planes of qubits are parallel.

The quantum information processing system may comprise any suitable and desired number of qubits. In one embodiment the quantum information processing system comprises 10 or more qubits, e.g. 20 or more qubits, e.g. 50 or more qubits, e.g. 100 or more qubits.

In one embodiment the quantum information processing system comprises processing circuitry arranged to operate on one or more of the plurality of qubits, e.g. to manipulate the state of the one or more qubits. Preferably the processing circuitry is arranged to implement one or more, e.g. high fidelity single and two-qubit, quantum logic gates throughout the qubit array in the system. Also preferably the processing circuitry is arranged to implement high fidelity single shot qubit measurement on at least a subset of the qubits in the array. Also preferably the processing circuitry is arranged to implement one or more error correction schemes, e.g. using feedback algorithms. This enables the quantum information processing system to perform useful quantum computations.

Figure 2:
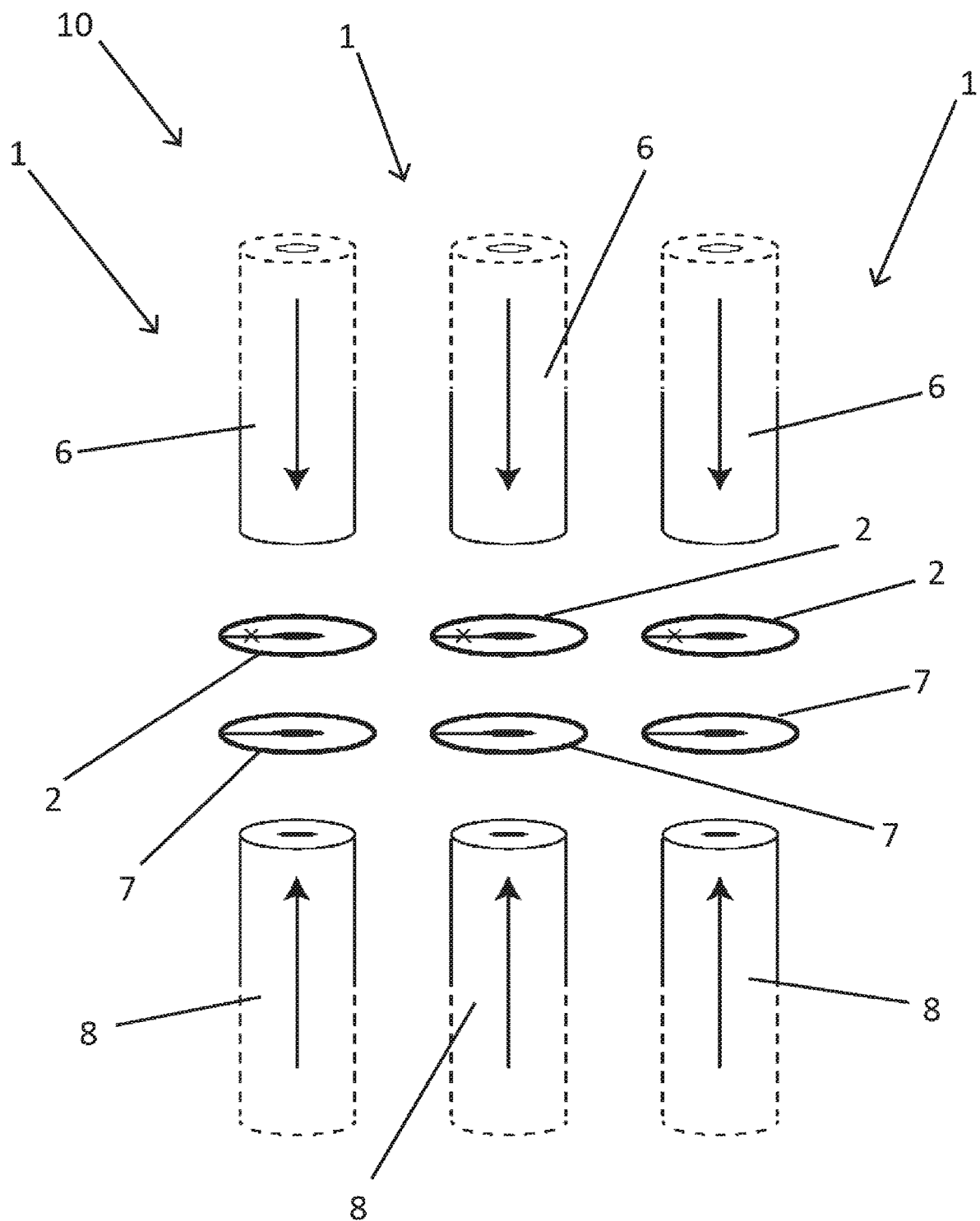
Figure 3:
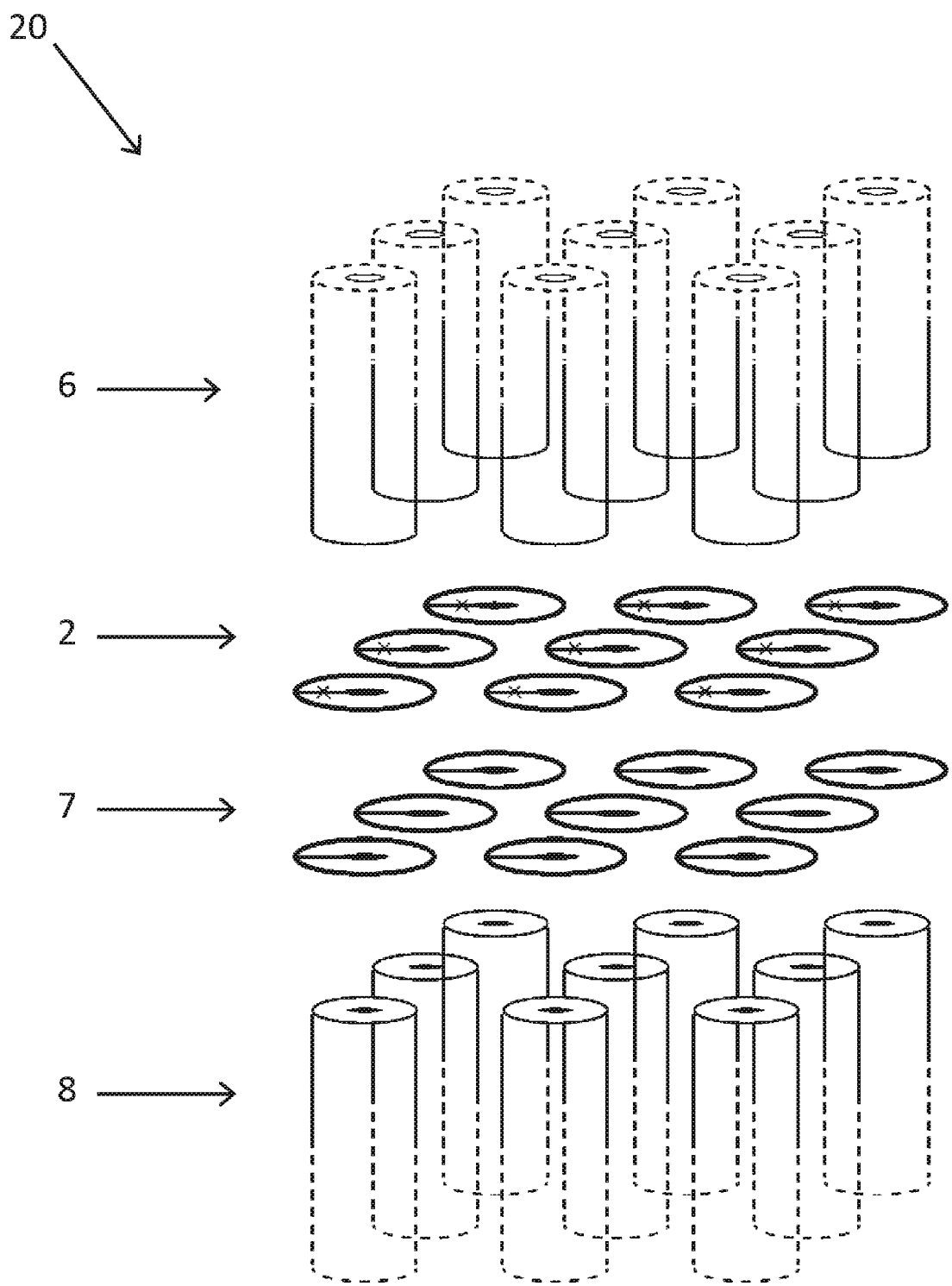
Figure 4:
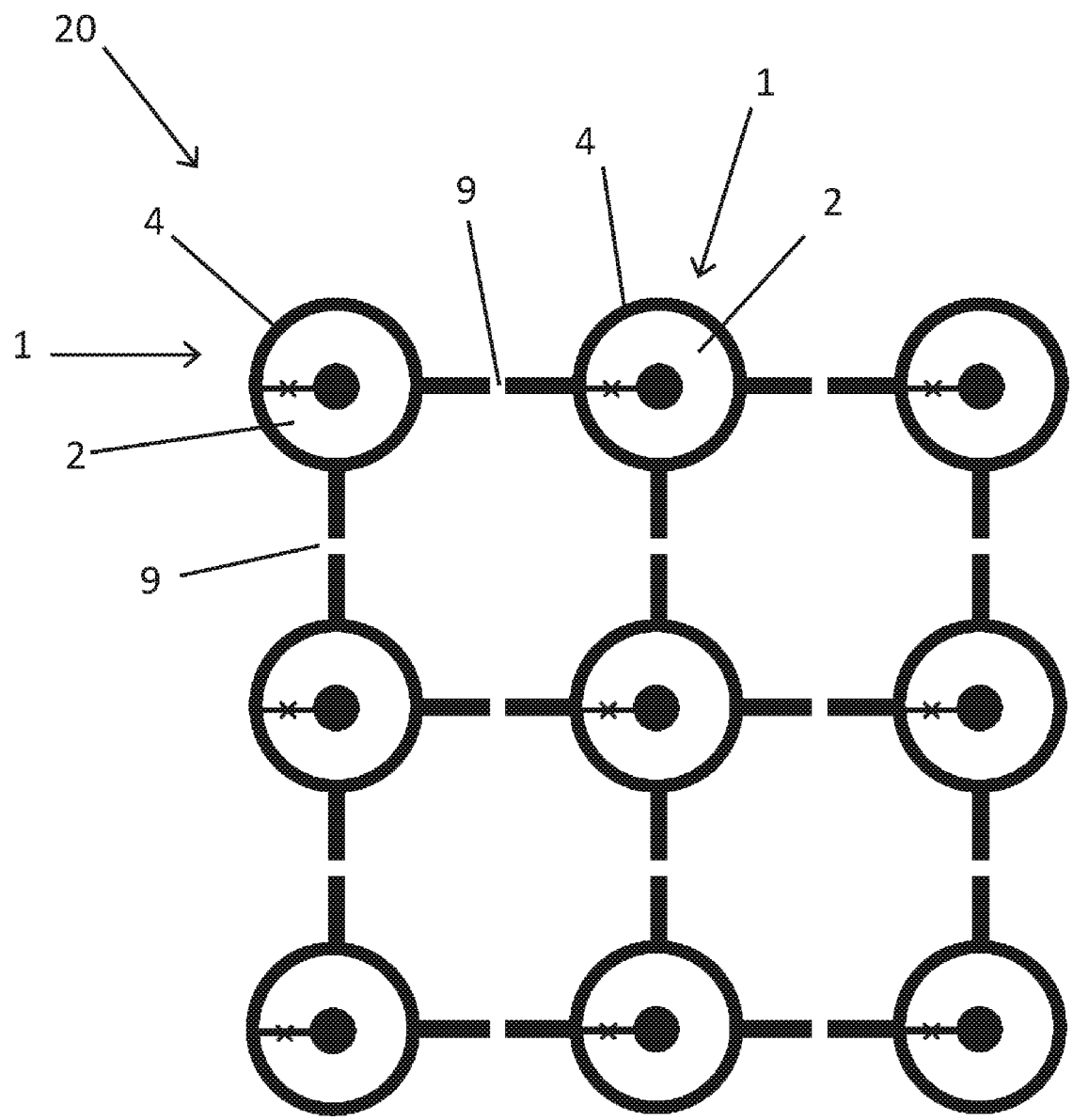
Figure 5:
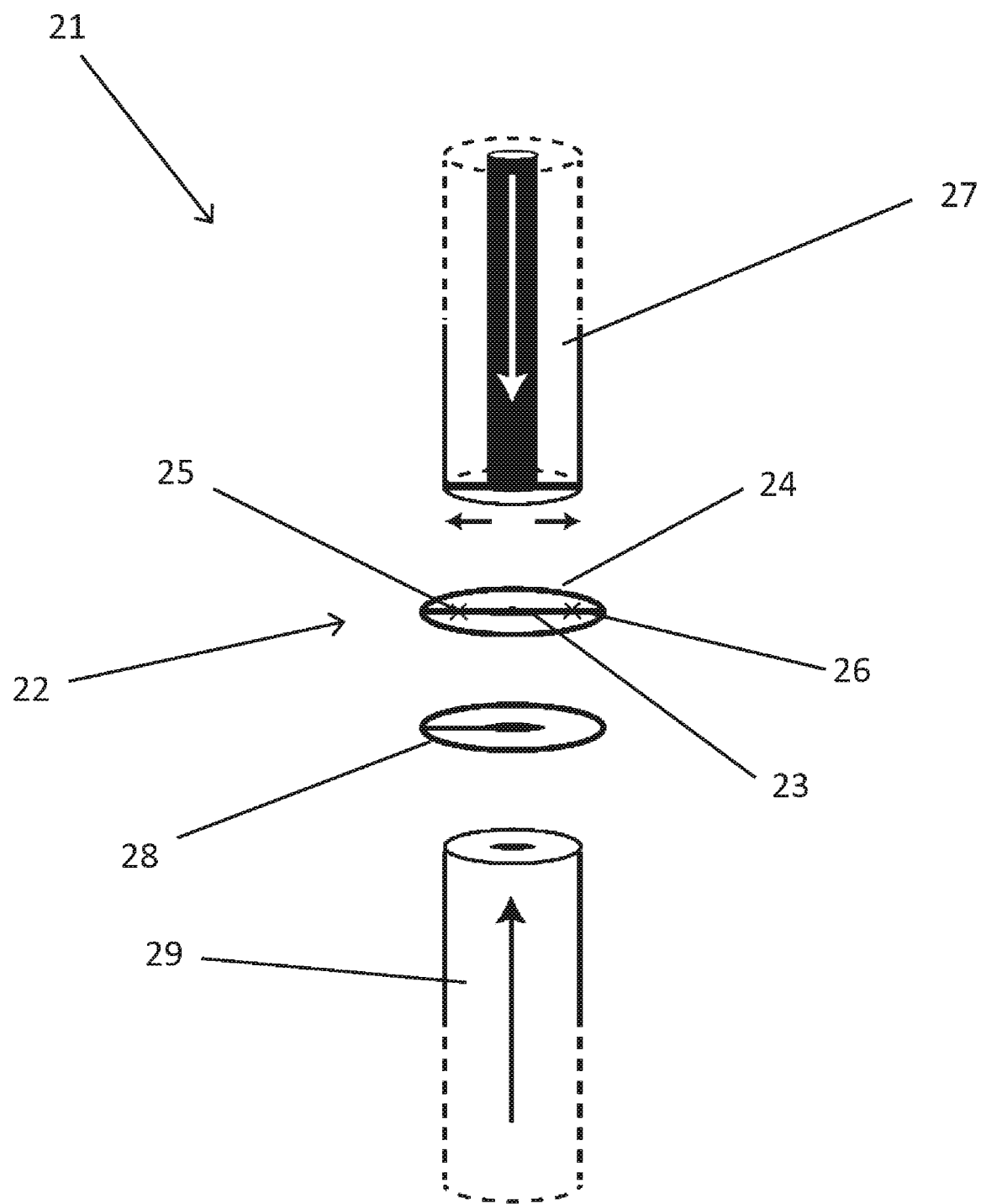

Embodiments of the invention will now be described, by way of example only, with reference to the accompanying drawings, in which:

a. FIG. 1 shows a building block for use in a quantum information processing system according to an embodiment of the present invention;

b. FIG. 2 shows a group of the building blocks as shown in FIG. 1;

c. FIGS. 3 and 4 show an array of the building blocks as shown in FIG. 1; and d. FIG. 5 shows a building block for use in a quantum information processing system according to a further embodiment of the invention.

FIG. 1 shows schematically a building block 1 for use in a quantum information processing system according to an embodiment of the present invention. The building block 1 includes a superconducting qubit 2 having two superconducting electrodes 3, 4 and a Josephson junction 5 between the two superconducting electrodes 3, 4. The two superconducting electrodes 3, 4 are arranged as a circular inner superconducting electrode 3 which is surrounded by a coaxial and coplanar circular outer superconducting electrode 4. The Josephson junction 5 is arranged to extend radially between the two superconducting electrodes 3, 4. The superconducting qubit 2 may be formed using microfabrication of low loss superconducting materials, such as aluminium, on a low loss dielectric substrate, such as sapphire or silicon.

In order to control the quantum state of the superconducting qubit 2, a control line 6 is provided coaxially with the superconducting qubit 2. The control line 6 is arranged to radiate the superconducting qubit 2 with microwaves in order to set the state of the superconducting qubit 2.

On the other side of the superconducting qubit 2 is provided a readout resonator 7 and a readout line 8, both of which are also arranged coaxially with the superconducting qubit 2. The readout resonator 7 is arranged to couple to the superconducting qubit 2 in such a way that its resonant frequency is dependent on the state of the superconducting qubit 2. The readout line 8 is arranged to radiate the resonator 7 and measure the frequency shift of the resonator 7 and thus the state of the superconducting qubit 2 via the reflected microwave signal.

FIG. 2 shows schematically a group 10 of three of the building blocks 1 as shown in FIG. 1, arranged in a straight line. The superconducting qubits 2 all lie in the same plane and thus can be formed on the same substrate. The resonators 7 can be formed on the reverse side of the same substrate, or on a separate substrate. As will be shown with reference to FIG. 4, though not shown in FIG. 2, the outer superconducting electrode 4 of each superconducting qubit 2 is connected via a capacitor to the outer superconducting electrode 4 of the nearest neighbouring qubit 2.

FIG. 3 shows schematically a group 20 of nine of the building blocks 1 as shown in FIG. 1, arranged in a square array. The superconducting qubits 2 all lie in the same plane and thus can be formed on the same substrate. The resonators 7 can be formed on the reverse side of the same substrate, or on a separate substrate. As will be shown with reference to FIG. 4, though not shown in FIG. 3, the outer superconducting electrode 4 of each superconducting qubit 2 is connected via a capacitor to the outer superconducting electrode 4 of the nearest neighbouring superconducting qubit 2.

FIG. 4 shows schematically a plan view of the building blocks 1 shown in FIG. 3. As can be seen, the building blocks 1 are arranged in a square array with the outer superconducting electrode 4 of each superconducting qubit 2 being connected via a capacitor 9 to the outer superconducting electrode 4 of the nearest neighbouring superconducting qubit 2.

In addition, to implement the quantum information processing system including the building blocks 1 as shown in FIGS. 1 to 4, the system will include a number of standard control electronics (not shown), e.g. connected to the end of each of the coaxial cables, e.g. including the control lines 6 and readout lines 8, as well as a suitable cooling system (not shown) required to keep the necessary components at a superconducting temperature.

In operation the quantum information processing system 10 or 20 is provided as part of a quantum computer, for example. The control lines 6 apply a pulse of microwave radiation to their respective superconducting qubits 2, the length, phase and/or amplitude of which is used to control the state of the superconducting qubits 2, i.e. the state of the qubit, and perform single qubit operations. Multiqubit (e.g. two-qubit) quantum logic operations are implemented in any desired manner, e.g. by applying appropriate microwave pulses to the control lines 6, making use of the capacitive or otherwise coupling between qubits. The quantum state of the superconducting qubits 2 is thus manipulated by a sequence of quantum logic gates to perform computations using the quantum information processing system 10 or 20.

Once the computations have been performed, the readout resonators 7 are used to measure the state of their respective superconducting qubits 2, e.g. by measuring the amplitude and/or phase of a microwave signal applied to readout lines 8, radiating the readout resonators 7 close to their resonant frequency, which is dependent on the state of their respective superconducting qubit 2. The state of the superconducting qubits 2 after the computations have been performed can then be used to determine the result of the computations.

FIG. 5 shows schematically a building block 21 for use in a quantum information processing system according to a further embodiment of the invention. The building block 21 of this embodiment is similar to the building block shown in FIGS. 1 to 4, i.e. it includes a superconducting qubit 22 having two superconducting electrodes 23, 24 that are arranged as a circular inner superconducting electrode 23 which is surrounded by a coaxial and coplanar circular outer superconducting electrode 24.

The difference is that the superconducting qubit 22 comprises two Josephson junctions 25, 26 which extend radially between the two superconducting electrodes 23, 24. This renders the superconducting qubit 22 flux tuneable, i.e. its transition frequency can be tuned by altering the magnetic flux threading the two spaces between the two electrodes of the superconducting qubit 22.

The control line 27 is provided coaxially with the superconducting qubit 22 and is able to provide magnetic flux control to the superconducting qubit 22. The readout resonator 28 and a readout line 29 are provided on the opposite side of the superconducting qubit 22 and the readout line 29 is also used as a control line for implementation of single qubit control which, in the embodiment shown in FIG. 1, is achieved using the control line 6.

As with the building block shown with reference to FIGS. 1 to 4, the building block 21 of FIG. 5 is arranged as part of an array of building blocks to form a quantum information processing system.

The operation of the building block 21 shown in FIG. 5 (as part of a quantum information processing system) is similar to the building block shown in FIGS. 1 to 4, i.e. the control line 27 is arranged to set the quantum state of the superconducting qubit 22 by applying a magnetic flux to the superconducting qubit 22. The state of the building block 21 (along with others in the quantum information processing system) is then manipulated and subsequently measured using the readout resonator 28 and readout line 29.

Thus it will be appreciated that the building block and quantum information processing system of the present invention help to significantly reduce the electromagnetic coupling of the building block to uniform electromagnetic fields compared to a superconducting qubit having a linear geometry, because the superconducting electrodes of the superconducting qubit do not lie along a single direction. Thus the building block is isolated effectively from the electromagnetic environment, which helps to increase the coherence time of the qubit.

It will also be appreciated that by providing a building block for a quantum information processing system in which the control line and readout element are arranged out of plane with respect to the plane of the two superconducting electrodes of the superconducting qubit, the topology of a quantum information processing system comprising a plurality of building blocks is able to scale in the same way as the number of building blocks (qubits).

The invention claimed is:

1. A method for quantum information processing, comprising:
    providing a superconducting qubit, the superconducting qubit comprising a plurality of superconducting electrodes that are coplanar and a dielectric between superconducting electrodes of the plurality of superconducting electrodes; and
    performing at least one of the following steps (i) or (ii):
    (i) using a control unit coupled to the superconducting qubit to control a quantum state of the superconducting qubit;
    (ii) using a readout unit coupled to the superconducting qubit to measure a quantum state of the superconducting qubit;

wherein at least one of the control unit or the readout unit is outside of a plane definable through the superconducting electrodes of the plurality of superconducting electrodes.

2. The method as claimed in claim 1, wherein the control unit is coaxial with at least one superconducting electrode of the plurality of superconducting electrodes or the readout unit is coaxial with at least one superconducting electrode of the plurality of superconducting electrodes.

3. The method as claimed in claim 1, wherein the superconducting electrodes of the plurality of superconducting electrodes are coaxial.

4. The method as claimed in claim 1, wherein the plurality of superconducting electrodes is coaxial with at least one of the control unit or the readout unit, or wherein the control unit is coaxial with the readout unit.

5. The method as claimed in claim 1, wherein an outer superconducting electrode of the plurality of superconducting electrodes comprises a ground plane.

6. The method as claimed in claim 1, wherein at least two superconducting electrodes of the plurality of superconducting electrodes are radially symmetric.

7. The method as claimed in claim 1, further comprising tuning a frequency of the superconducting qubit.

8. The method as claimed in any claim 1, wherein the control unit comprises a magnetic flux control line.

9. The method as claimed in claim 1, further comprising controlling the quantum state of the superconducting qubit using a universal control provided by the control unit.

10. The method as claimed in claim 1, wherein using a control unit to control the quantum state of the superconducting qubit comprises applying a pulse of electromagnetic radiation to the superconducting qubit.

11. The method as claimed in claim 1, further comprising inferring the quantum state of the superconducting qubit, wherein the readout unit comprises:
 a readout resonator coupled to the superconducting qubit; and
 a coaxial cable arranged to measure a response of the readout resonator.

12. The method as claimed in claim 1, wherein the control unit and the readout unit are formed as a single element, and the method comprises performing both of the steps (i) and (ii).

13. A method for quantum information processing, comprising:
 providing a plurality of superconducting qubits to form a quantum information processing system, wherein at least some superconducting qubits of the plurality of superconducting qubits are coupled to one or more other superconducting qubits of the plurality of superconducting qubits, and wherein each superconducting qubit of the plurality of superconducting qubits comprises a plurality of superconducting electrodes that are coplanar and a dielectric between superconducting electrodes of the plurality of superconducting electrodes; and
 performing at least one of the following steps (i) or (ii):
  (i) using a control unit coupled to a superconducting qubit of the plurality of superconducting qubits to control a quantum state of the superconducting qubit;
  (ii) using a readout unit coupled to a superconducting qubit of the plurality of superconducting qubits to measure a quantum state of the superconducting qubit;
 wherein at least one the control unit or the readout unit is outside of a plane definable through the superconducting electrodes of the plurality of superconducting electrodes.

14. The method as claimed in claim 13, wherein the control unit is only coupled to a single superconducting qubit.

15. The method as claimed in claim 13, wherein the readout unit is only coupled to a single superconducting qubit.

16. The method as claimed in claim 13, wherein one or more superconducting qubits of the plurality of superconducting qubits are coupled to a nearest other superconducting qubit of the plurality of superconducting qubits.

17. The method as claimed in claim 13, wherein the at least some superconducting qubits are coupled with the one or more other superconducting qubits with a coupling comprising a capacitor.

18. The method as claimed in claim 13, wherein the superconducting qubits of the plurality of superconducting qubits are arranged in an array.

19. The method claimed in claim 13, further comprising operating a processing circuitry on one or more superconducting qubits of the plurality of superconducting qubits.

20. The method as claimed in claim 19, further comprising implementing one or more quantum logic gates using the processing circuitry.

* * * * *